(12) United States Patent  
Iizuka

(10) Patent No.: US 6,525,295 B2
(45) Date of Patent: Feb. 25, 2003

(54) LASER IMAGING APPARATUS

(75) Inventor: Takashi Iizuka, Saitama-ken (JP)

(73) Assignee: Pentax Corporation, Tokyo (JP)

( * ) Notice: Subject to any disclaimer, the term of this patent is extended or adjusted under 35 U.S.C. 154(b) by 40 days.

(21) Appl. No.: 09/879,940

(22) Filed: Jun. 14, 2001

(65) Prior Publication Data
US 2001/0054700 A1 Dec. 27, 2001

(30) Foreign Application Priority Data

Jun. 14, 2000 (JP) ........................................ 2000-178252

(51) Int. Cl.[7] .............................................. B23K 26/00
(52) U.S. Cl. ................................ 219/121.68; 219/121.8
(58) Field of Search ....................... 219/121.68, 121.69, 219/121.77, 121.78, 121.8, 121.82; 359/207

(56) References Cited

U.S. PATENT DOCUMENTS 5,184,217 A * 2/1993 Doering
5,572,353 A    11/1996 Iizuka et al.
5,604,622 A     2/1997 Iizuka et al.
5,751,436 A *   5/1998 Kwon et al.
5,900,964 A     5/1999 Iizuka et al.
5,991,034 A *  11/1999 Ohtsuka
6,013,895 A *   1/2000 Steadman
6,246,204 B1 *  6/2001 Ebihara et al.

* cited by examiner

Primary Examiner—Samuel M. Heinrich
(74) Attorney, Agent, or Firm—Greenblum & Bernstein, P.L.C.

(57) ABSTRACT

A laser imaging apparatus for forming an image on a surface of a substrate is provided with a laser source that emits a laser beam, a table mounting the substrate, the table being movable in a first direction within a predetermined plane, a scanning optical system which receives and deflects the laser beam emitted by the laser source to form a scanning beam spot on the substrate, the scanning beam spot scanning in a second direction that is perpendicular to the first direction, and a mechanism that moves the scanning optical system in the second direction.

15 Claims, 6 Drawing Sheets

LASER IMAGING APPARATUS

BACKGROUND OF THE INVENTION

The present invention relates to a laser imaging apparatus, which forms an image on a surface using a scanning laser beam.

Conventionally, a laser imaging apparatus such as a direct imager or a laser photo-plotter is used for forming a circuit pattern on a substrate for a printed-circuit board or a semiconductor element. In such a laser imaging apparatus, a laser beam emitted by a laser source is deflected by a polygonal mirror so that the defected beam scans on a surface on which photo-resistive material is provided. During the scanning operation, the laser beam is modulated in accordance with an image to be formed on the surface. Further, the surface exposed to the scanning beam is moved in a direction perpendicular to the scanning line. Thus, a two-dimensional image is formed on the surface.

Recently, there is a need for a laser imaging apparatus which is capable of forming an image on a surface wider in size. In order to form a wide image, it is necessary to widen an effective scanning range of the scanning optical system. For this purpose, an optical system of the laser imaging apparatus, i.e., the polygonal mirror and an imaging optical system may be made large in size. However, in such a configuration, image formation density is lowered (i.e., density of pixels consisting of an image is lowered).

For avoiding such defects, an imaging apparatus provided with a plurality of scanning optical systems has been suggested. Specifically, the plurality of optical systems are arranged along the scanning direction, and a surface to be scanned is divided into a plurality of areas along the scanning direction, which are scanned by the plurality of scanning optical systems, respectively. The adjoining image segments formed by adjoining scanning systems are generally connected seamlessly. With this configuration, a wide image can be formed with maintaining the high density.

Another need is a "multiple imaging" or to form a plurality of relatively small images on a wide circuit board using the imaging apparatus having a plurality of scanning systems. In this case, each of the plurality of scanning systems is used for forming the smaller image so that the plurality of images are formed on the wide circuit board. This course of manufacturing process enables the obtaining of a large amount of circuit boards respectively corresponding to the smaller images in a relatively short period of time.

When such a "multiple imaging" is performed, it is important that a clearance should be provided between the adjoining images, since the circuit board is to be cut at the clearance later to form smaller boards respectively having the plurality of images. Therefore, when the multiple imaging is performed, the effective scanning range of each scanning system is not fully used since the images should be separated with a certain clearance formed therebetween.

SUMMARY OF THE INVENTION

It is therefore an object of the invention to provide an improved laser imaging apparatus, which has a plurality of scanning systems aligned in a main scanning direction, capable of forming a seamless large image using the plurality of scanning systems, and of forming small images, with a clearance therebetween, using the entire effective scanning ranges of the plurality of scanning systems.

For the above object, there is provided a laser imaging apparatus for forming an image on a surface of a substrate, which is provided with a laser source unit that emits a plurality of laser beams, a table mounting the substrate, the table being movable in a first direction within a predetermined plane, a plurality of scanning optical systems which receive and deflect the plurality of laser beams emitted by the laser source unit to form scanning beam spots on the surface, respectively, the scanning beam spots scanning in a second direction that is perpendicular to the first direction, and a mechanism that moves the at least one of the plurality of scanning optical systems in the second direction.

According to this configuration, by adjusting the location of the scanning system in the second direction, the object can easily be achieved.

Optionally, each of the plurality of scanning optical systems has an effective scanning range defined along the second direction, and the laser imaging apparatus further includes a controller. When a plurality of image patterns, each of which has a width, in the second direction, not greater than the effective scanning range are to be formed, the controller controls the plurality of scanning optical systems to form the plurality of image patterns, respectively, and the controller may further control the mechanism to locate the at least one of the plurality of scanning optical systems at a position where the plurality of image patterns respectively formed by the plurality of scanning optical systems are separated from each other by a predetermined amount.

Optionally or alternatively, when an image pattern whose width, in the second direction, is greater than the effective scanning range is to be formed, the controller divides the image pattern into a plurality of image segments in accordance with the number of the plurality of scanning optical systems, the controller further controlling the mechanism to locate the at least one of the plurality of scanning optical systems at a position where the image segments respectively formed by the plurality of scanning optical systems are connected to form the image pattern.

In a particular case, the widths of the plurality of image segments may be substantially the same.

Optionally, a central portion of each of the plurality of scanning optical systems is located at the center of the width of each of the image segments when they are formed.

In a particular case, the plurality of scanning optical systems consist of two scanning optical systems.

In this case, only one of the two scanning optical systems may be driven by the mechanism to move in the second direction.

According to another aspect of the invention, there is provided a laser imaging apparatus for forming an image on a surface of a substrate, which is provided with a laser source that emits a laser beam, a table mounting the substrate, the table being movable in a first direction within a predetermined plane, a scanning optical system which receives and deflects the laser beam emitted by the laser source to form a scanning beam spot on the substrate, the scanning beam spot scanning in a second direction that is perpendicular to the first direction, and a mechanism that moves the scanning optical system in the second direction.

Optionally, the scanning optical system has an effective scanning range defined in the second direction, and the laser imaging apparatus may further include a controller. When a plurality of image patterns, each of which has a width, in the second direction, not greater than the effective scanning range, are to be formed the controller controls the scanning optical system to form the plurality of image patterns, sequentially, and the controller may further control the mechanism to move the scanning optical system such that the plurality of image patterns sequentially formed by the scanning optical system are separated from each other by a predetermined amount.

Optionally or alternatively, when an image pattern whose width, in the second direction, is greater than the effective scanning range is to be formed, the controller divides the image pattern into a plurality of image segments, and the controller may further control the mechanism such that the plurality of image segments are formed sequentially, the plurality of image segments sequentially formed by the scanning optical system are seamlessly connected to form the image pattern.

Optionally, a central portion of the scanning optical system is located at the center of the width of each of the image segments when each of the image segments is formed.

In a particular case, a central portion of the effective scanning range of the scanning optical system is located at the center of the width of each of the image patterns when each of the image patterns is formed.

Still optionally, the image segments may have substantially the same widths.

DETAILED DESCRIPTION OF THE EMBODIMENTS

Hereinafter, two embodiments will be described with reference to the accompanying drawings.

First Embodiment

Figure 1:
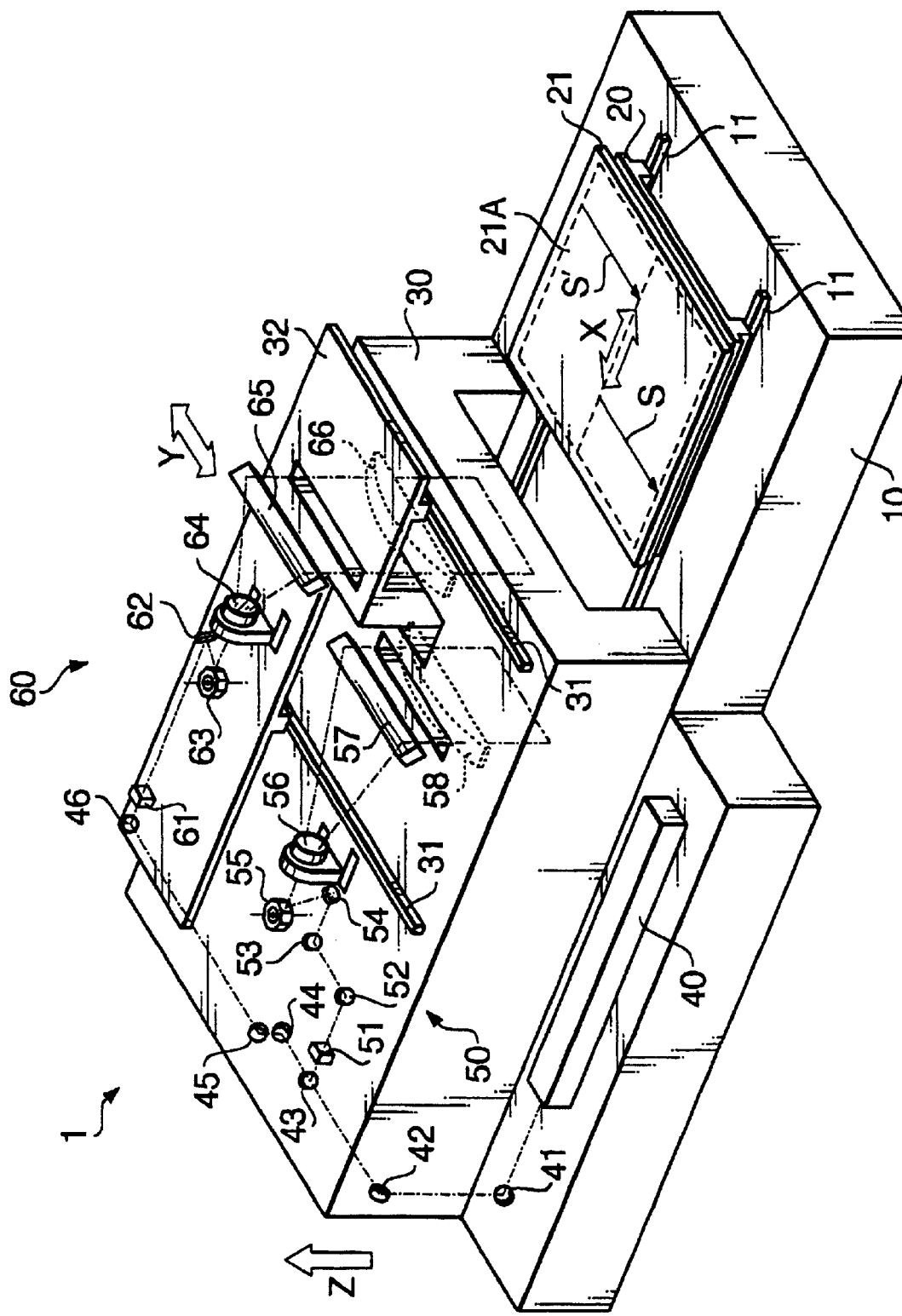
FIG. 1 schematically shows a perspective view of a laser imaging apparatus according to an embodiment of the invention.

FIG. 1 schematically shows a perspective view of a laser imaging apparatus 1 according to a first embodiment of the invention.

The laser imaging apparatus 1 is provided with a base 10, a table 20 on which a substrate for a circuit board is placed, an optics mount 30, a laser source 40, a first scanning optical system 50, and a second scanning optical system 60.

The table 20 is slidably mounted on rails 11 and 11 provided on a top surface of the base 10, and is reciprocally moved, by a table driving system (not shown), in an X-axis direction on the base 10. The optics mount 30 is fixedly mounted on the base 10. The laser source 40 is fixed aside the base 10. The first scanning optical system 50 is fixedly mounted on the optics mount 30. The second scanning optical system 60 is movable, on the optics mount 30, in a Y-axis direction, which is perpendicular to the X-axis direction. It should be noted that an X-Y plane is parallel with the top surface of the base, which is parallel to the horizontal plane when the laser imaging apparatus 1 is in use.

A laser beam emitted by the laser source 40 is reflected by first and second mirrors 41 and 42 in this order, proceeds in the Y-axis direction, and is incident on a half mirror 43, which splits the incident beam into a reflected beam and a transmitted (passed-through) beam.

The reflected beam is incident on the first scanning system 50. Firstly, the beam that enters the first scanning system 50 is ON-OFF modulated by an AOM (acousto-optical modulator) 51 in accordance with image data. The modulated beam is reflected by first through third mirrors 52–54 in that order, and is incident on a polygonal mirror 55. As the polygonal mirror 55 revolves, the incident beam is deflected to scan within a predetermined angular range. The scanning beam passes through an fθ lens 56, and is incident on a mirror 57, which directs the beam toward the table 20. The beam reflected by the mirror 57 is converged by a condenser lens 58 so that a beam spot is formed on a surface 21A of the substrate 21 on which an image is to be formed. The beam spot moves, in the Y-axis direction, on the surface of the substrate 21 so that a scanning line along the Y-axis direction is formed as the polygonal mirror 55 rotates to form a scanning line S which extends in the Y-axis direction. It should be noted that, in view of the quality of the formed image, only a predetermined part, which has a certain length, of the scanning line is used practically for image formation, which will be referred to as an effective scanning width. Generally, on the surface 21A to be scanned, the X-axis direction is referred to as an auxiliary scanning direction, and the Y-axis direction is referred to as a main scanning direction.

The laser beam transmitted through the half mirror 43 is incident on a fifth mirror 46 mounted on an optics stage 32, which is movable in the Y-axis direction along rails 31. It should be noted that the position of the fifth mirror 46 in a Z-axis direction, which is perpendicular to the X-axis and Y-axis directions, is different from that of the half mirror 43. Therefore, the position of the beam traveling from the half mirror 43 to the fifth mirror 46 in the Z-axis direction is shifted using third and fourth mirrors 44 and 45. The laser beam reflected by the fourth mirror 45 proceeds in the Y-axis direction. Therefore, even if the optics stage 32 moves in the Y-axis direction, i.e., the fifth mirror 46 moves in the Y-axis direction, the beam is always incident on the fifth mirror 46.

The laser beam reflected by the fifth mirror 46 is incident on the second scanning optically system 60 mounted on the optics stage 32.

The laser beam incident on the second scanning optical system 60 is ON-OFF modulated using an AOM 61, and is directed to a polygonal mirror 63 via a mirror 62. The beam is deflected by the polygonal mirror 63 such that the deflected beam scans within a predetermined angular range. The scanning beam (i.e., the deflected beam) is incident on a mirror 65 via an fθ lens 64. The beam reflected by the mirror 65 is converged by a condenser lens 66 and forms a beam spot on the surface 21A. The beam spot formed by the second scanning optical system moves in the Y-axis direction as the polygonal mirror 63 rotates to form a scanning line S' which extends in the Y-axis direction.

The second scanning optical system 60 and the fifth mirror 46 move in the Y-axis direction as the optics stage 32 is reciprocally moved in the Y-axis direction, along the rail 31, by a not-shown driving system. The scanning line S' defined on the surface 21A is moved in the Y-axis direction as the optics stage 32 moves in the Y-axis direction.

The positions of the condenser lenses 58 and 66, along the Z-axis, with respect to the surface 21A are the same. The condenser lens 66 is mounted on the optics stage 32 such that the condenser lens 66 is shifted in the X-axis direction with respect to the condenser lens 58 so as not to interfere therewith when the optics stage 32 moves in the Y-axis direction.

Figure 2:
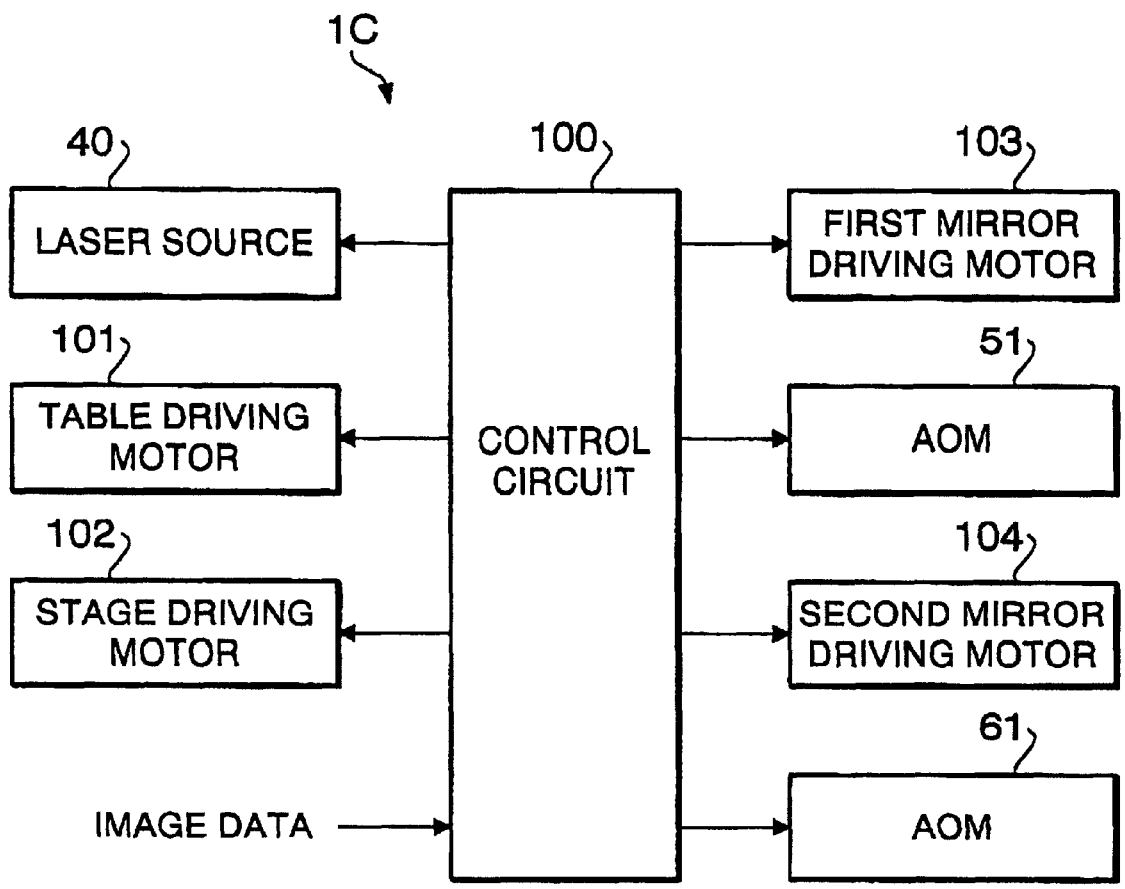
FIG. 2 is a block diagram of a control system of the laser imaging apparatus shown in FIG. 1.

FIG. 2 is a block diagram of a control system 1C of the imaging apparatus 1.

The control system 1C includes a table driving motor 101, a stage driving motor 102, the laser source 40, the AOM 51, the first mirror driving motor 103, the AOM 61, the second mirror driving motor 104, and a control circuit 100 connected thereto.

The control circuit 100 outputs command signals to each devices (i.e., the table driving motor 101, stage driving motor 102, laser source 40, AOM 51, first mirror driving motor 103, AOM 61, second mirror driving motor 104) connected thereto in accordance with inputted image data and/or commands.

In response to the command signals transmitted from the control circuit 100:
  the laser source 40 emits the laser beam;
  the first and second mirror driving motors 103 and 104 are actuated to rotate the polygonal mirrors 55 and 63, respectively;
  the table driving motor 101 drives the table 20 to move in the X-axis direction along the rails 11;
  the stage driving motor 102 drives the optics stage 32 along the rails 31; and
  the AOM 51 and 61 ON-OFF modulates the laser beams passing therethrough, respectively.

As the scanning beams, which are ON-OFF modulated, form the scanning lines S and S' extending in the Y-axis direction, and the table 20 moves in the X-axis direction, two-dimensional images are formed, in accordance with the image data, on the surface 21A of the substrate 21.

It should be noted that, prior to the image formation, the control circuit 100 adjusts the position of the second scanning optical system 60 with respect to the first scanning optical system 50 by driving the stage driving motor 102, in accordance with the image data and various commands.

Figure 3:
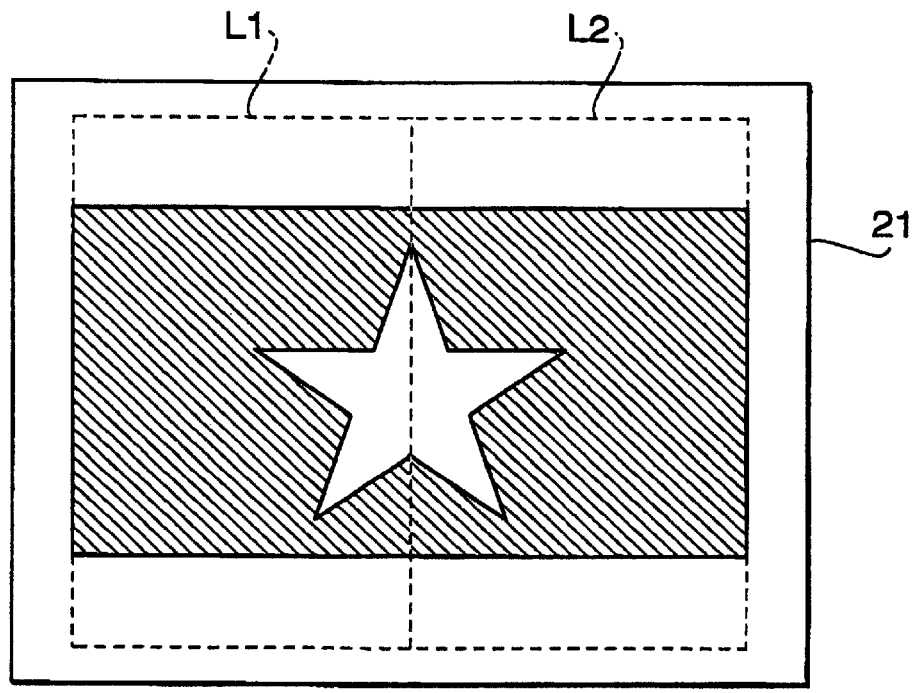
FIG. 3 illustrates imaging areas when a wide image is formed.

FIG. 3 shows imaging areas of the first and second scanning optical systems 50 and 60 when a wide image is formed. FIGS. 4A and 4B show imaging areas of the first and second scanning optical systems 50 and 60 when small images are formed. FIGS. 5A and 5B show positions of images formed by the first and second scanning systems 50 and 60, respectively, when the width of the image is slightly smaller than the sum of the scanning widths of the first and second scanning optical systems 50 and 60.

When an image whose width is equal to the sum of the effective scanning widths of the first and second scanning optical systems 50 and 60, the control circuit 100 moves the second scanning optical system 60 to be located such that an Inner end (i.e., the left-hand side end in FIG. 3) of an image forming area L2 of the second scanning optical system 60 coincides with an inner end (i.e., the right-hand side end in FIG. 3) of an image forming area L1 of the first scanning optical system 50 as shown in FIG. 3. It should be noted that the widths of the imaging areas L1 and L2 coincide with the effective scanning widths of the first and second scanning optical systems 50 and 60, respectively. The entire image is substantially evenly divided along the Y-axis direction, and divided portions (which will be referred to as image segments hereinafter) are formed by the first and second scanning optical systems 50 and 60, respectively. With this configuration, a relatively large image pattern, whose width is substantially the same as the sum of the effective scanning widths of the first and second scanning optical systems 50 and 60, can be formed as a seamless image by the first and second scanning optical systems 50 and 60.

When an image pattern whose width is less than the effective scanning width of either of the scanning optical systems 50 and 60, the control circuit 100 controls one of the first and second scanning optical systems 50 and 60 to form the image. The first or second scanning optical system 50 or 60 is selected depending on the position where the image is to be formed. It should be noted that if the imaging area does not meet the scanning area of the first scanning optical system 50 which is fixed in position, the second scanning optical system 60 can be used since the position of the second scanning optical system 60 in the Y-axis direction can be adjusted by moving the optics stage 32.

Figure 4:
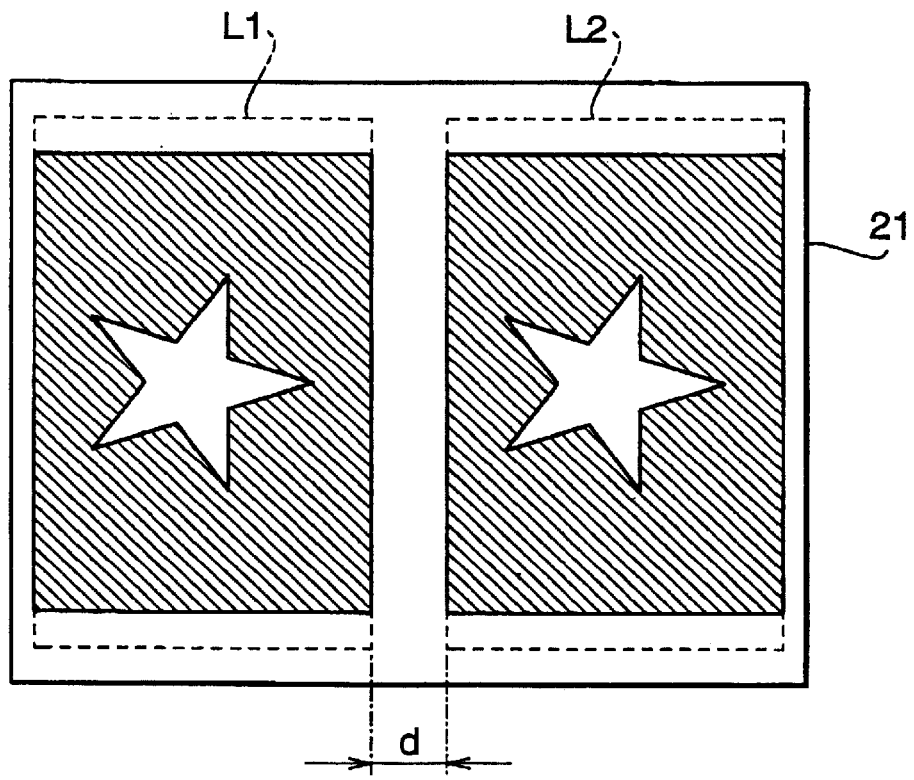
FIG. 4 illustrates imaging areas when small images are formed.
Figure 5A:
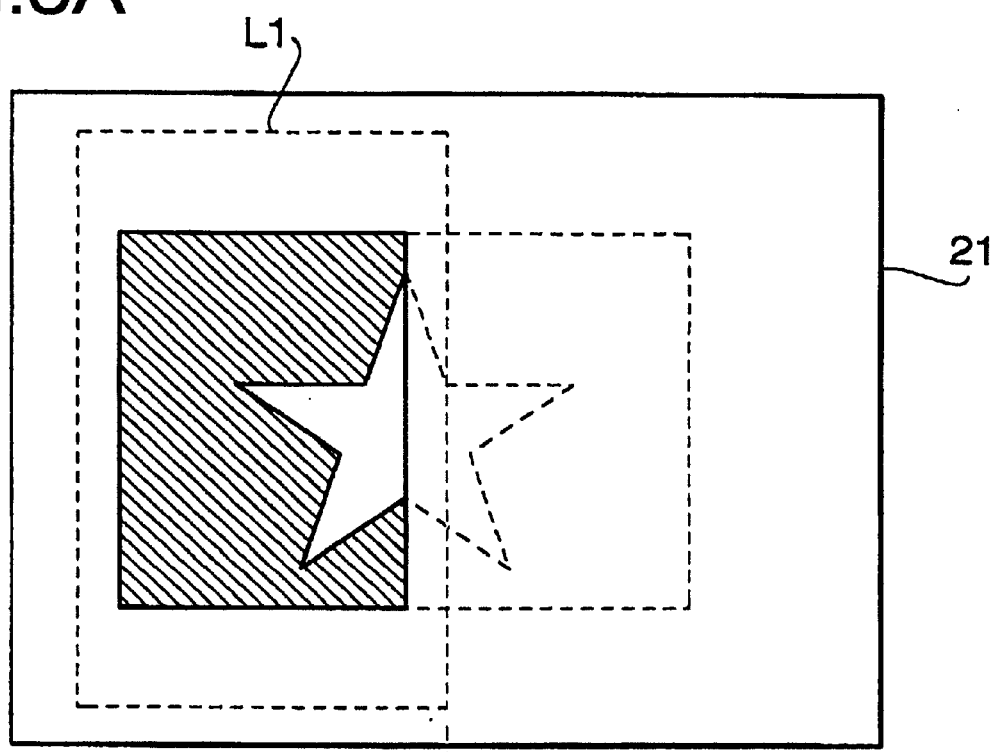
FIGS. 5A and 5B shows imaging areas when a wide image is formed.
Figure 5B:
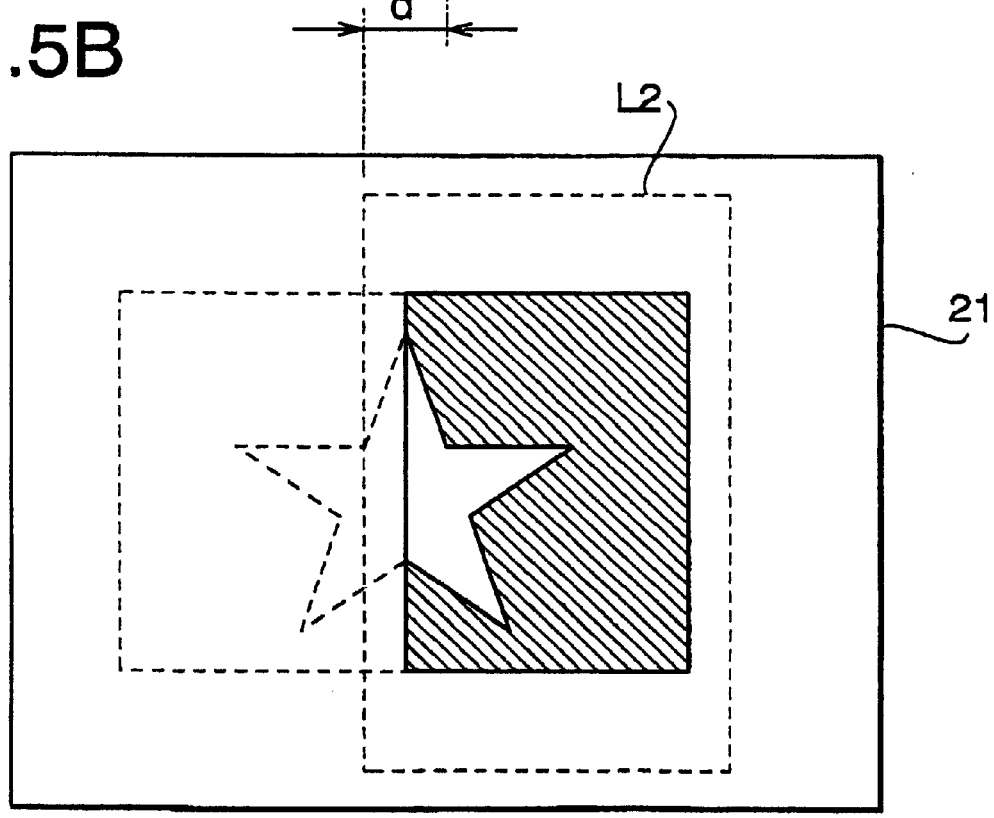

When an image includes two image segments, and an imaging width of each of the image segments is equal to or less than the effective scanning widths of the first and second scanning optical systems 50 and 60, the control circuit 100 controls the second scanning optical system 60 to move in the Y-axis direction such that the imaging area L2 is slightly spaced, by a distance d, from the imaging area L1 as shown in FIG. 4. With this configuration, the effective scanning widths of the first and second scanning optical systems 50 and 60 are fully used to form the image segments with forming a clearance between the images. Thus, the substrate 21 can be cut at the clearance the width of which is d.

When an image whose width is smaller than the sum of effective scanning widths of the first and second scanning optical systems 50 and 60, the control circuit 100 moves the second scanning optical system 60 to be located such that the image forming area L2 partially overlaps with the image forming area L1 by an amount d' as shown in FIGS. 5A and 5B. Then, the entire image is substantially evenly divided into two image segments, and divided image segments are formed by the first and second scanning optical systems 50 and 60, respectively. It should be noted that, in this case, the peripheral portions of the effective scanning areas of the first and second scanning optical systems 50 and 60 are not used for the image formation. With this configuration, a relatively large image pattern can be formed seamlessly by the first and second scanning optical systems 50 and 60.

With this configuration, after the position, in the Y-axis direction, of the optics stage 32 is adjusted, only by moving the table 20 in the X-axis direction once, two images are formed simultaneously. Thus, a period of time necessary for imaging is shortened in comparison to a case where the two images are formed sequentially.

When the width of an image is smaller than the sum of the effective scanning widths of the first and second scanning optical systems 50 and 60, it is possible to form such an image with the configuration shown in FIG. 3, i.e., the areas L1 and L2 are next to each other but not overlap. Even with such a configuration, a seamless large image can be formed. However, generally, the quality of the image formed using the central portion of the scanning optical system is better than that formed using the peripheral portions thereof. Therefore, as shown in FIGS. 5A and 5B, it is preferable that image segments are formed using the central areas of the effective scanning widths of the first and second scanning optical systems 50 and 60, respectively.

As described above, according to the laser imaging apparatus 1, the second scanning optical system 60 can be moved in the Y-axis direction in accordance with the width of the image pattern to be formed. Therefore, if the width of the image pattern is substantially equal to the sum of the effective scanning widths of the first and second scanning optical systems 50 and 60, a seamless image pattern can be formed.

Further, if the image width is slightly smaller than the sum of the effective scanning widths of the first and second scanning optical systems 50 and 60, the image pattern can also be formed seamlessly at a high accuracy.

Furthermore, when two images are to be formed by the respective scanning optical systems, since the second scanning optical system 60 can be moved in the Y-axis direction so that the imaging area L2 is spaced from the imaging area L1, the effective scanning widths of both scanning optical systems 50 and 60 can be fully used, with leaving the cut portion between the images.

It should be stressed that, according to the first embodiment, by adjusting the position in the Y-axis direction, of the optics stage 32, and performing the scanning operations, two images are formed simultaneously by the scanning optical systems 50 and 60, respectively.

Second Embodiment

Figure 6:
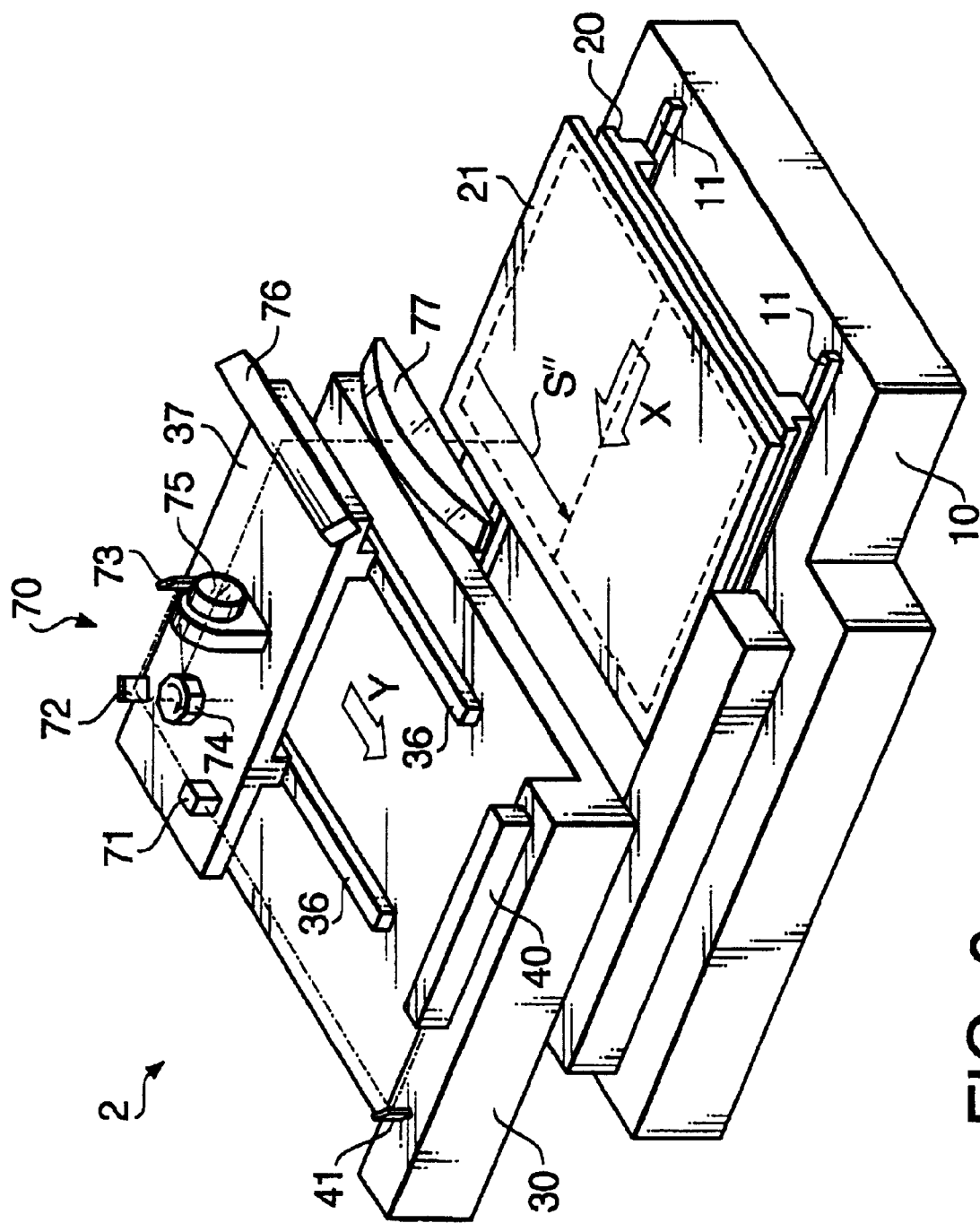
FIG. 6 schematically shows a perspective view of a laser imaging apparatus according to a second embodiment of the invention.
Figure 7:
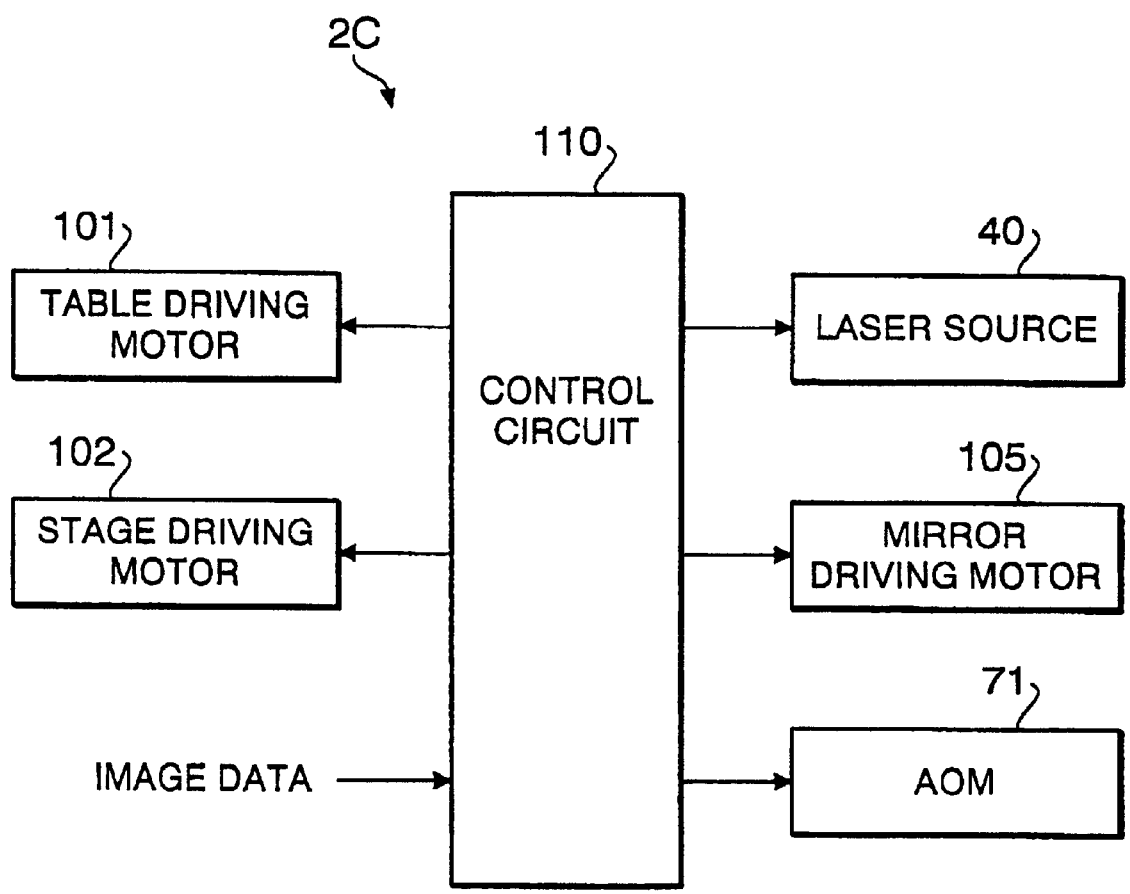
FIG. 7 is a block diagram of a control system of the laser imaging apparatus shown in FIG. 6.

FIG. 6 schematically shows a perspective view of an imaging apparatus 2 according to a second embodiment of the invention. FIG. 7 is a block diagram of a control system of the imaging apparatus 2 shown in FIG. 6.

The laser imaging apparatus 2 is configured such that, the first scanning optical system 50 is omitted from the laser imaging apparatus 1, and both image segments in the imaging areas L1 and L2 are formed by a single movable scanning optical system.

The laser imaging apparatus 2 according to the second embodiment includes, as shown in FIG. 6, a base 10, a table 20 which is mounted on the base 10 and is movable in the X-axis direction, an optics mount 30 secured on the base 10, a laser source 40 mounted on the optics mount 30, and a scanning optical system 70 which is movably mounted on the optics mount 30. The scanning optical system 70 is movable in the Y-axis direction which is perpendicular to 1the X-axis direction within a horizontal plane.

The table 20 is guided by rails 11 mounted on the base 10, and is driven by a not-shown driving system to reciprocally move in the X-axis direction.

A laser beam emitted by the laser source 40 is reflected by a mirror 41 to proceed in the Y-axis direction, and is incident on the scanning optical system 70.

The laser beam incident on the scanning optical system 70 is ON-OFF modulated using the AOM 71, and is directed to the polygonal mirror 74 via first and second mirrors 72 and 73. The beam is deflected by the polygonal mirror 74 such that the deflected beam scans within a predetermined scanning angle range. The scanning beam (i.e., the deflected beam) is incident on a mirror 76 via an fθ lens 75. The beam reflected by the mirror 76 is converged by a condenser lens 77 and forms a beam spot on the surface of the substrate 21. The beam spot formed by the scanning optical system 70 moves in the Y-axis direction as the polygonal mirror 74 rotates to form a scanning line S which extends in the Y-axis direction.

The scanning optical system 70 is mounted on a movable optics stage 37, which is slidably mounted on rails 36 secured on the optics station 30. By moving the optics stage 37, the scanning optical system 70 is moved in the Y-axis direction. It should be noted that, since the laser beam reflected by the mirror 41 proceeds in the Y-axis direction, even if the optics stage 37 is moved and the AOM 71 moves in the Y-axis direction, it is ensured that the beam is incident on the AOM 71.

The control system 2C includes, as shown in FIG. 7, a table driving motor 101, a stage driving motor 102, the laser source 40, the AOM 71, a mirror driving motor 105, and a control circuit 110 connected thereto.

The control circuit 110 outputs command signals to each devices (i.e., the table driving motor 101, stage driving motor 102, laser source 40, AOM 71, mirror driving motor 105) connected thereto in accordance with inputted image data and/or commands.

In response to the command signals transmitted from the control circuit 110:

the laser source 40 emits the laser beam;

the mirror driving motor 105 is actuated to rotate the polygonal mirror 74;

the table driving motor 101 drives the table 20 to move in the X-axis direction along the rails 11;

the stage driving motor 102 drives the optics stage 37 in the Y-axis direction along the rails 36; and the AOM 71 ON-OFF modulates the laser beam passing therethrough, respectively.

It should be noted that, similarly to the first embodiment, prior to each image formation, the control circuit 110 adjusts the position of the scanning optical system 70 by driving the stage driving motor 102 in accordance with the image data and the various commands.

Thus, a two dimensional image is formed on the surface in accordance with the image data.

According to the second embodiment, if a width of an image pattern to be formed on the surface 21 is greater than the effective scanning width of the scanning optical system 70, the image pattern is divided into image segments each of which has a width which is not greater than the effective scanning width of the scanning optical system 70. Then, the image segments are processed sequentially, one at a time, with adjusting the locations, in the Y-axis direction, of the scanning optical system 70.

Specifically, according to the second embodiment, when the width of the image pattern is greater than the effective scanning width, the image pattern is divided into two segments having substantially the same widths. Then, firstly, the optics stage 37 is moved such that the optical axis of the scanning optical system 70 is located at the center of the width of one of the image segments. Then, the first image segment is formed. Then, the optics stage 37 is moved so that the optical axis thereof is located at the center of the width of the other of the image segments, and the second half is formed.

For this purpose, the control circuit 110 determines moving amounts of the optics stage 37 to locate the same for forming the image segments, and what is formed (i.e., the image segment to be formed) at each image forming operation, in accordance with the image data and various inputted commands.

For example, if an image pattern corresponding to inputted image data has a width greater than the effective scanning width of the scanning optical system 70, the control circuit 110 divides the image pattern into two image segments having substantially the same widths in the Y-axis direction. Then, the control circuit 110 moves the optics stage 37 such that the optical axis of the scanning optical system 70 is located at the center of each image segment and forms the same. In this case, the moving amount of the optics stage 37 is adjusted such that the first image segment and the second image segment are seamlessly connected to form a large image pattern.

If two image patterns spaced from each other in the Y-axis direction are to be formed, the control circuit 110 drives the scanning optical system 70 to form the two image patterns sequentially. It should be noted that when the second image pattern is formed, the control circuits 110 moves the scanning optical system 70 such that the second image pattern is spaced from the first image pattern in the Y-axis direction by a predetermined amount so that the circuit board is cut at the clearance between the two images.

In particular, if the width of each image pattern is smaller than the effective scanning width of the scanning optical system 70, each image pattern can be formed at one image forming operation. Alternatively, if two separate image patterns are to be formed and the width of each image pattern is greater than the effective scanning width, each image pattern can be formed by two image forming operation as described above. It is apparent that, even in such a case, the clearance between the two image patterns can easily be formed simply by adjusting the moving amount of the optics table 37 in the Y-axis direction.

The present disclosure relates to the subject matter contained in Japanese Patent Application No. 2000-178252, filed on Jun. 14, 2000, which is expressly incorporated herein by reference in its entirety.

What is claimed is:

1. A laser imaging apparatus for forming an image on a surface of a substrate, comprising:

a laser source unit that emits a plurality of laser beams;

a table mounting the substrate, said table being movable in a first direction within a predetermined plane;

a plurality of scanning optical systems which receive and deflect the plurality of laser beams emitted by said laser source unit to form scanning beam spots on the surface, respectively, said scanning beam spots scanning in a second direction that is perpendicular to said first direction; and a mechanism that moves said at least one of said plurality of scanning optical systems in said second direction.

2. The laser imaging apparatus according to claim 1, wherein each of said plurality of scanning optical systems has an effective scanning range defined along the second direction, wherein said laser imaging apparatus further comprises a controller, wherein when a plurality of image patterns each of which has a width, in the second direction, not greater than said effective scanning range are to be formed, said controller controls said plurality of scanning optical systems to form the plurality of image patterns, respectively, said controller further controlling said mechanism to locate said at least one of said plurality of scanning optical systems at a position where the plurality of image patterns respectively formed by said plurality of scanning optical systems are separated from each other by a predetermined amount.

3. The laser imaging apparatus according to claim 2, wherein a central portion of the effective scanning range of each of said plurality of scanning optical systems is located at the center of the width of each of said image patterns.

4. The laser imaging apparatus according to claim 2, wherein when an image pattern whose width, in the second direction, is greater than said effective scanning range is to be formed, said controller divides the image pattern into a plurality of Image segments in accordance with the number of said plurality of scanning optical systems, said controller further controlling said mechanism to locate said at least one of said plurality of scanning optical systems at a position where the image segments respectively formed by said plurality of scanning optical systems are connected to form the image pattern.

5. The laser imaging apparatus according to claim 4, wherein widths of said plurality of image segments are substantially the same.

6. The laser imaging apparatus according to claim 4, wherein a central portion of each of said plurality of scanning optical systems is located at the center of the width of each of said image segments.

7. The laser imaging apparatus according to claim 6, wherein widths of said plurality of image segments are substantially the same.

8. The laser imaging apparatus according to claim 1, wherein said plurality of scanning optical systems consist of two scanning optical systems.

9. The laser imaging apparatus according to claim 8, wherein only one of said two scanning optical systems is driven by said mechanism to move in said second direction.

10. A laser imaging apparatus for forming an image on a surface of a substrate, comprising:

a laser source that emits a laser beam;

a table mounting the substrate, said table being movable in a first direction within a predetermined plane;

a scanning optical system which receives and deflects the laser beam emitted by said laser source to form a scanning beam spot on the substrate, said scanning beam spot scanning in a second direction that is perpendicular to said first direction; and a mechanism that moves said scanning optical system in said second direction.

11. The laser imaging apparatus according to claim 10, wherein said scanning optical system has an effective scanning range defined along the second direction, wherein said laser imaging apparatus further comprises a controller, wherein when a plurality of image patterns, each of which has a width, in the second direction, not greater than said effective scanning range, are to be formed, said controller controls said scanning optical system to form the plurality of image patterns, sequentially, said controller further controlling said mechanism to move said scanning optical system such that the plurality of image patterns sequentially formed by said scanning optical system are separated from each other by a predetermined amount.

12. The laser imaging apparatus according to claim 11, wherein a central portion of the effective scanning range of said scanning optical system is located at the center of the width of each of said image patterns when each of said image patterns is formed.

13. The laser imaging apparatus according to claim 11, wherein when an image pattern whose width, in the second direction, is greater than said effective scanning range is to be formed, said controller divides the image pattern into a plurality of image segments, said controller further controlling said mechanism such that said plurality of image segments are formed sequentially, said plurality of image segments sequentially formed by said scanning optical system are seamlessly connected to form the image pattern.

14. The laser imaging apparatus according to claim 13, wherein a central portion of said scanning optical system is located at the center of the width of each of said image segments when each of said image segments is formed.

15. The laser imaging apparatus according to claim 11, said image segments have substantially the same widths.

* * * * *